United States Patent
Jordanger et al.

(10) Patent No.: US 7,183,793 B2
(45) Date of Patent: Feb. 27, 2007

(54) SYSTEMS AND METHODS FOR REDUCING ELECTROMAGNETIC EMISSIONS FROM A CONTROLLER AREA NETWORK TRANSCEIVER

(75) Inventors: Ricky Dale Jordanger, Allen, TX (US); Anthony Sepehr Partow, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 161 days.

(21) Appl. No.: 11/045,709

(22) Filed: Jan. 28, 2005

(65) Prior Publication Data

US 2006/0170451 A1   Aug. 3, 2006

(51) Int. Cl.
*H03K 17/16* (2006.01)
(52) U.S. Cl. ............................. 326/26; 326/82; 333/12
(58) Field of Classification Search .................. 326/26, 326/27, 30, 82, 83; 333/12
See application file for complete search history.

(56) References Cited

U.S. PATENT DOCUMENTS

| | | | |
|---|---|---|---|
| 5,455,539 A | 10/1995 | Mazoyer et al. | |
| 5,539,778 A | 7/1996 | Kienzler et al. | |
| 5,592,510 A | 1/1997 | Van Brunt et al. | |
| 6,429,700 B1 | 8/2002 | Yang | |
| 6,731,135 B2 | 5/2004 | Brunolli | |
| 2004/0043739 A1 | 3/2004 | Jordanger et al. | |
| 2004/0189391 A1* | 9/2004 | Muljono | 330/258 |
| 2006/0091915 A1* | 5/2006 | Pauletti et al. | 327/108 |
| 2006/0160511 A1* | 7/2006 | Trichy et al. | 455/255 |

\* cited by examiner

*Primary Examiner*—Don Le
(74) *Attorney, Agent, or Firm*—W. James Brady, III; Frederick J. Telecky, Jr.

(57) ABSTRACT

Systems are provided for reducing electromagnetic emissions from a controller area network transceiver. A driver circuit is operative to transmit communications across an associated bus. A static driver replica circuit approximates a common-mode voltage associated with a dominant state associated with the bus. A receiver attenuator bias circuit forces a common-mode voltage associated with the driver circuit to be equal to the approximated dominant state common-mode voltage during a recessive state associated with the bus.

20 Claims, 4 Drawing Sheets

US 7,183,793 B2

SYSTEMS AND METHODS FOR REDUCING ELECTROMAGNETIC EMISSIONS FROM A CONTROLLER AREA NETWORK TRANSCEIVER

TECHNICAL FIELD

The present invention relates generally to electrical circuits, and more particularly to systems and methods for reducing electromagnetic emissions from a controller area network transceiver.

BACKGROUND

One of the most challenging aspects of controller area network (CAN) transceiver design is the development of a driver output that meets the stringent electromagnetic compatibility (EMC) standards required by customers. A typical CAN transceiver consists of a CAN driver and a CAN receiver that are internally connected in the integrated circuit by respective common pins, CAN high (CANH) and CAN low (CANL). The driver portion connected to the CANH pin has only an active pull-up device and the driver portion connected to the CANL pin only has an active pull-down device. The ISO 11898 physical layer standard allows CANH to be actively pulled high, but must be passively pulled low by an external load or light internal biasing provided by the CAN receiver. The CANL pin is just the opposite. CANL can be actively pulled low, but must be passively pulled high by the external load or light internal biasing provided by the CAN receiver. This physical layer standard was chosen to avoid driver arbitration issues when one driver on the bus is trying to pull a bus line low while another driver is trying to pull the same bus line high.

The driver outputs turn on into a low impedance state called the dominant state in CAN nomenclature. This is commonly referred to as a digital "1" in a positive logic system. The driver outputs turn off into a high impedance state called the recessive state in CAN nomenclature. This is commonly referred to as a digital "0" in a positive logic system. The recessive state is also considered to be a tri-state condition with a light bus biasing. The typical DC load on a CAN driver is a 60 Ω differential load as specified by the standard. A typical CAN receiver consists primarily of a resistor attenuator and a hysteresis comparator. The attenuator is necessary to attenuate the external common-mode of the bus signals on CANH and CANL down to values that are within the power supplies of the CAN transceiver. The common-mode range of the ISO11898 standard is specified as a minimum of −2 V to +7 V while the power supply is nominally 5 V and 0 V. High performance CAN transceivers have stretched the allowable bus common-mode range to −12 V to +12 V and higher. Thus, the attenuator must be designed to conform to the ISO11898 standard.

Many applications have stringent electromagnetic compatibility requirements for CAN transceivers. The manner in which the ISO11898 CAN physical layer is specified leads to major difficulties in designing balanced CAN driver outputs that minimize emitted radiation. Since the CANH pin can only pull actively high and the CANL pin can only pull actively low, the driver design is especially difficult to balance out when transitioning from a dominant state to a recessive state.

SUMMARY

In accordance with an aspect of the present invention, a driver system is provided for a controller area network transceiver. A driver circuit is operative to transmit communications across an associated bus. A static driver replica circuit approximates a common-mode voltage associated with a dominant state associated with the bus. A receiver attenuator bias circuit forces a common-mode voltage associated with the driver circuit to be equal to the approximated dominant state common-mode voltage during a recessive state associated with the bus.

In accordance with another aspect of the present invention a driver system is provided for a controller area network transceiver. A driver circuit is operative to transmit communications across an associated bus. A driver bias circuit ramps first and second current sources associated with the driver circuit during transitions between dominant and recessive states associated with the bus. A dynamic driver replica circuit approximates a common-mode voltage associated with the driver circuit during the state transitions, compares the approximated common-mode voltage to a reference voltage, and provides a correction to the driver circuit to drive the common-mode voltage associated with the driver toward the reference voltage.

In accordance with yet another aspect of the present invention, a method is provided for mitigating electromagnetic emissions associated with a driver circuit that communicates on an associated bus. A common-mode voltage associated with a dominant state associated with the bus is approximated. A common-mode voltage associated with the driver circuit is forced to be equal to the approximated dominant state common-mode voltage during a recessive state associated with the bus. The common-mode voltage associated with the driver circuit is approximated during transitions between dominant and recessive states associated with the bus. The approximated transition common-mode voltage to a reference voltage. A correction is provided to the driver circuit to drive the common-mode voltage associated with the driver toward the reference voltage during state transitions.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The common-mode signal, $V_{oc}$, of a controller area network (CAN) driver is the main source of radiated emissions. The common-signal can be defined as:

$$V_{oc} = (CANH + CANL)/2 \tag{Eq. 1}$$

where Voc is the common-mode voltage, CANH represents the voltage at the high common pin of the driver, and CANL represents the voltage at the low common pin of the driver.

The reduction of electromagnetic emissions in the $V_{oc}$ signal focuses on two characteristics of the common-mode signal. The first signal characteristic is the difference, $\Delta V_{oc}$, between the steady state common-mode voltage in the recessive and dominant states of the driver. Differences between the steady state common-mode voltage in the two states causes the driver to emit electromagnetic radiation in the AM band. A second characteristic is the peak-to-peak variation, $V_{oc(pp)}$, in the common-mode signal during transitions between the recessive and the dominant bus states. Large $V_{oc(pp)}$ signals cause the driver to generate higher frequency FM band radiation, because the $V_{oc(pp)}$ signals are much faster than the signaling rate of CAN drivers.

Figure 1:
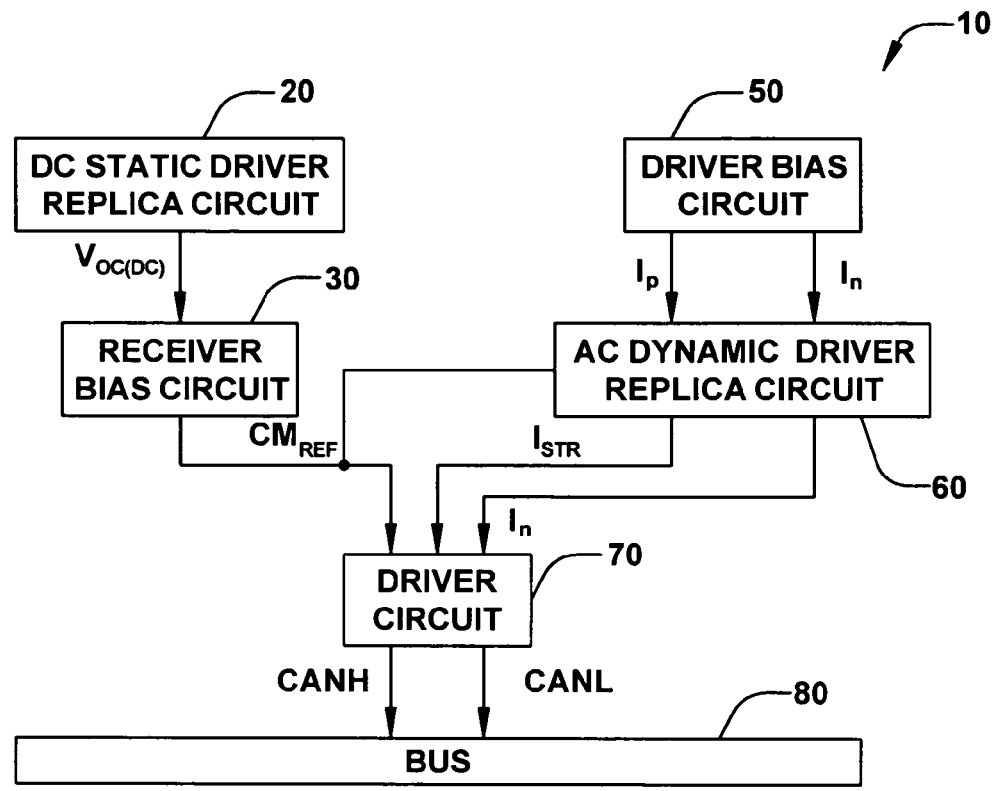
FIG. 1 illustrates a driver system for a controller area network transceiver in accordance with an aspect of the present invention.

FIG. 1 illustrates a driver system 10 for a controller area network transceiver in accordance with an aspect of the present invention. A static driver replica circuit 20 comprises a scaled down replica of a driver circuit 70 associated with the transceiver. The scaled down replica circuit 20 can be implemented to have a resistance greater than the driver circuit 70 by a multiplicative factor, such that the replica circuit can run at the same voltage as the driver circuit while utilizing a smaller amount of current. The scaled down driver replica circuit 20 is operated to mimic the dominant bus state such that the dominant state common-mode voltage of the driver circuit can be approximated from an output of the driver replica circuit.

A receiver bias circuit 30 forces the common-mode voltage at the driver circuit 70 to be equal to the approximated dominant state common-mode voltage during a recessive state of the bus. For example, the approximated common-mode voltage can be provided to an attenuator network that provides an interface between the driver and the bus to maintain the desired common-mode voltage at the bus. Maintaining the recessive state common-mode voltage at the same level as the dominant common-mode voltage reduces the value of $\Delta V_{oc}$ and mitigates AM band emissions from the CAN transceiver.

A driver bias circuit 50, in combination with a dynamic AC replica network 60, helps to minimize high frequency FM emissions of the driver by minimizing the $V_{oc(pp)}$ signal. The action of the capacitor ramps current sources within the AC driver replica network on and off to provide a bias current. The dynamic replica circuit 60 comprises a scaled down replica of the driver circuit 70 associated with the transceiver. Like the static replica circuit 20, the dynamic replica circuit 60 can be implemented to have a resistance greater than the driver circuit 70 by a multiplicative factor, such that the replica circuit can run at the same voltage as the driver circuit while utilizing a smaller amount of current.

The dynamic replica circuit 60 is provided with the same ramped bias current as the driver circuit during state transitions. A common-mode voltage can be sampled from the dynamic replica circuit and compared to a reference voltage. Current from the current source can be steered toward or away from the driver input to direct the common-mode voltage toward the reference voltage. The controlled current source ramping from the driver bias circuit 50 allows the dynamic AC replica network 60 time to correct the $V_{oc(pp)}$ signal during switching. By maintaining the common-mode voltage around a reference voltage, the peak-to-peak variation, $V_{oc(pp)}$, in the common-mode signal during transitions is reduced, mitigating FM band emissions from the CAN transceiver.

Figure 2:
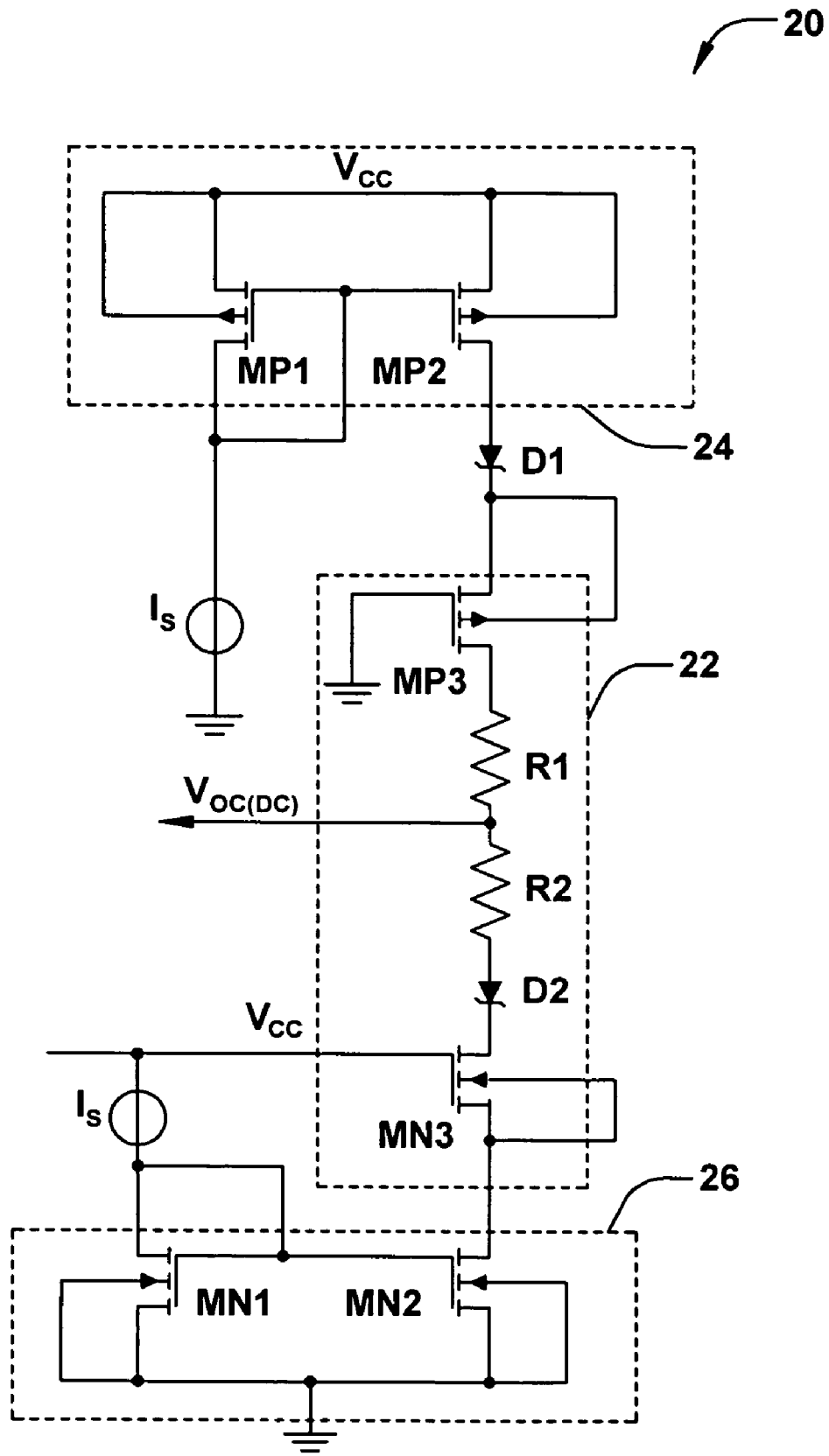
FIG. 2 illustrates a static DC driver replica network in accordance with an aspect of the present invention.

FIG. 2 illustrates a static DC driver replica network 20 in accordance with an aspect of the present invention. The purpose of the network is to track the strength of the respective driver output devices in order to form a voltage bias, $V_{oc}$, that will approximate the driver common-mode output voltage when the driver assumes a dominant state on the data bus. When coupled with the receiver attenuator bias circuit 30, the static DC driver replica network 20 controls AM band emissions by minimizing the $\Delta$Voc signal.

Specifically, transistors MP3 and MN3, along with diodes D1 and D2, provide a scaled replica 22 of the driver circuit 70. The scaled replica includes resistors R1 and R2 to approximate the effect of an external load applied to the driver outputs. The scaled DC replica is designed to provide a greater degree of resistance such that it can operate at a voltage approximating that of the driver circuit using only a fraction of the current. In an exemplary embodiment, the scaled replica is implemented using the same device types and configuration as the driver output, but is designed to be eighty times more resistive than the actual driver output devices in order to reduce the operating current and layout area of the DC driver replica network.

A bias current source, Is, is mirrored to MP3 at a first current mirror 24 formed from transistors MP1 and MP2. Similarly, a corresponding bias current course, $I_s$, is provided to MN3 through a second current mirror 26 formed from transistors MN1 and MN2. The current from these current sources are sufficient to approximate dominant state operation within the driver replica circuit. Accordingly, an approximation of the dominant common-mode voltage, $V_{oc}$ $_{(DC)}$, can be sampled from the replica circuit from the junction of the resistors, R1 and R2 and provided to the receiver attenuator bias circuit 30.

Figure 3:
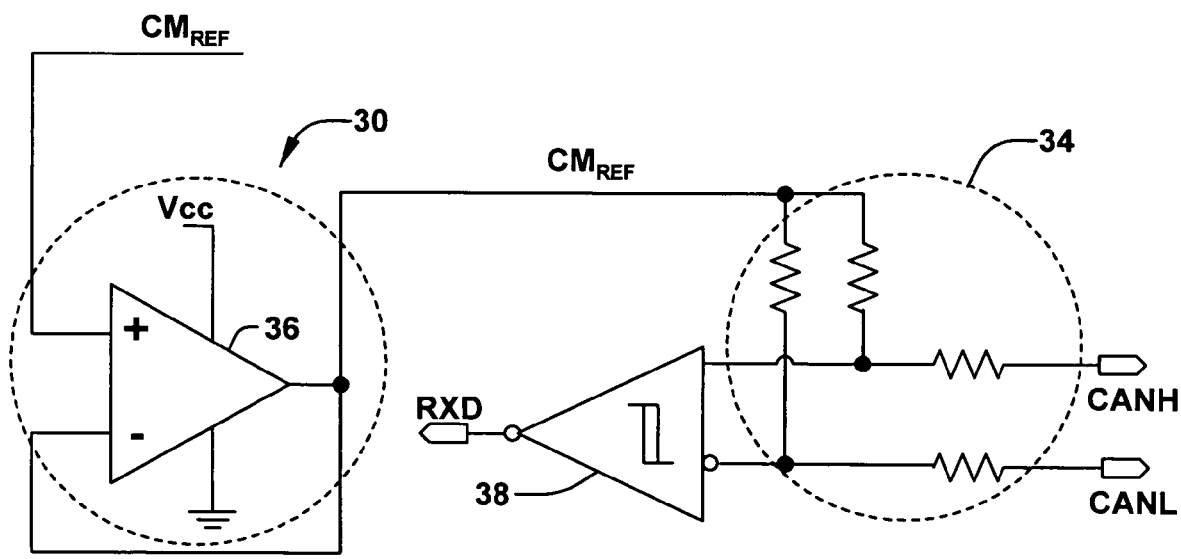
FIG. 3 illustrates a receiver attenuator bias circuit in accordance with an aspect of the present invention.

FIG. 3 illustrates a receiver attenuator bias circuit 30 in accordance with an aspect of the present invention. The receiver attenuator bias circuit 30 provides a voltage bias to the receiver attenuator network in order to force the recessive common-mode of the driver to be the same voltage as the dominant common-mode of the driver. This circuit, coupled with the static DC driver replica network 20, controls AM band emissions of the driver by minimizing the $\Delta$Voc signal. The bias circuit 30 is operatively connected to a receiver attenuator resistor network 34 that attenuate the external common-mode of the bus signals on CANH and CANL down to values that are within the power supplies of the CAN transceiver.

In accordance with an aspect of the present invention, the receiver attenuator bias circuit 30 forces the receiver attenuator resistor network 34 to assume the voltage of the dominant common-mode voltage sample, $V_{oc(DC)}$, provided by the static DC driver replica network output. The dominant common-mode voltage sample, $V_{oc}$, is buffered at a unity gain buffer amplifier 36. The unity gain amplifier 36 provides the reference voltage to force the receiver attenuator resistor network 34 to the reference common-mode voltage. The receiver attenuator resistor network 34 provides an interface between the bus pins, CANH and CANL, and the internal receiver comparator 38. When the reference dominant common-mode sense voltage is passed to the receiver attenuator network 36, the receiver attenuator network passes the voltage onto the bus through the attenuator resistor network. This forces the bus common-mode to be the same in the dominant and recessive states, minimizing the $\Delta$Voc, and accordingly, unwanted AM band emissions.

Figure 4:
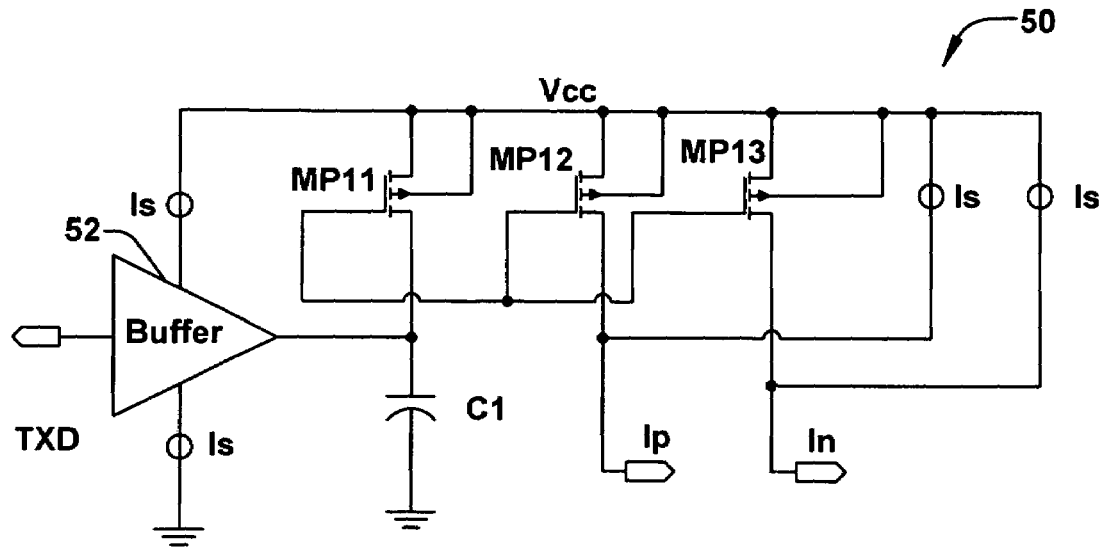
FIG. 4 illustrates a second exemplary filtering circuit that can be implemented in accordance with an aspect of the present invention.

FIG. 4 illustrates a driver bias circuit 50 in accordance with an aspect of the present invention. The driver bias circuit 50 actively ramps the current sources for the driver outputs and provides a very small bias current to the driver outputs during recessive state. The bias circuit, in combination with the dynamic AC replica network 60, helps to minimize high frequency FM emissions of the driver by minimizing the $V_{oc(pp)}$ signal. A current starved inverter 52 buffers a transmitter input signal, TXN. The current starved inverter 52 is connected to a capacitor, C1, such that it charges and discharges the capacitor according to the input signal. The action of the capacitor ramps current sources, $I_p$ and $I_n$, on and off to provide bias current to the AC driver replica network 60. Small output bias current sources, $I_s$, maintain the gates of the driver output current sources at the verge of activation through transistors MP11, MP12, and MP13. The controlled current source ramping allows the dynamic AC replica network 60 time to correct the $V_{oc(pp)}$ signal during switching. Thus the transition from high to low impedance state is conducted more smoothly than if the current sources were completely switched off.

Figure 5:
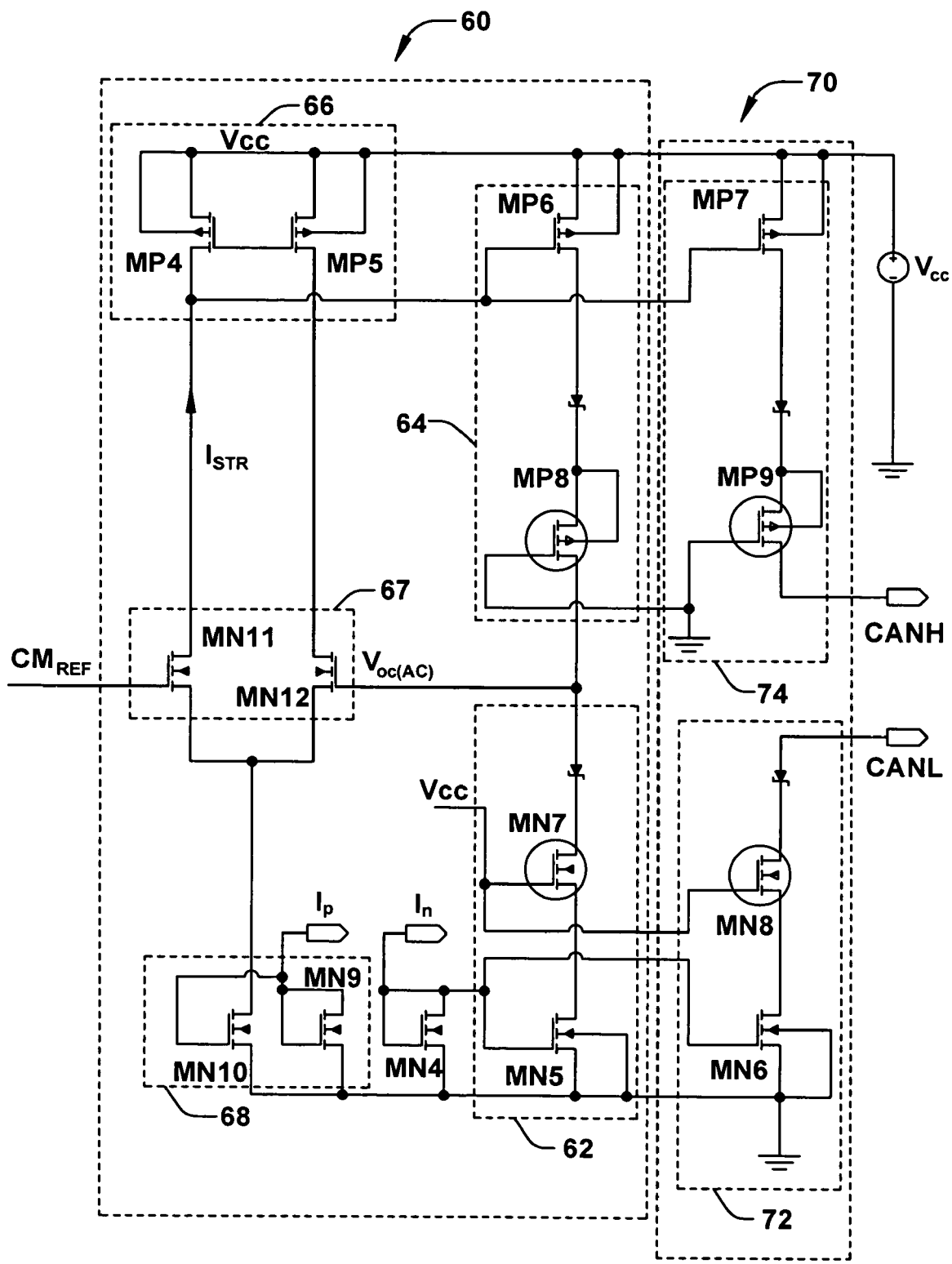
FIG. 5 illustrates a dynamic AC driver replica network in accordance with an aspect of the present invention in combination with a driver circuit.

FIG. 5 illustrates a dynamic AC driver replica network 60 in accordance with an aspect of the present invention in combination with a driver circuit 70. The dynamic AC driver replica network 60 minimizes the $V_{oc(pp)}$ signal of the driver by using an active compensation loop. The network minimizes the high frequency FM band emissions of the driver by minimizing the $V_{oc(pp)}$ signal. The dynamic AC driver replica network 60 uses the output of the receiver bias circuit 30, $CM_{REF}$, as a reference input and senses the dynamic common-mode of the driver 70 during switching. The driver 70 is actively switched by turning the output current sources, $I_p$ and $I_n$, on and off with the driver bias circuit 50.

Transistors MN6 and MN8 comprise a driver pull-down circuit 72. The driver pull down circuit receives current from the driver bias current $I_n$ through transistor MN4. The current from $I_n$ is also provided to a lower replica loop 62 of the AC driver replica circuit, comprising transistors MN5 and MN7. The lower replica loop 64 provides a scaled replica of the driver pull down circuit 72. Similarly, transistors MP7 and MP9 comprise a driver pull-up circuit 74. An upper replica loop 64 of the AC driver replica circuit, comprising transistors MP6 and MP8, provides a scaled replica of the driver pull-up circuit 74. In an exemplary embodiment, the replica loops 62 and 64 is selected to provide eighty times the resistance of their respective driver circuits 72 and 74, such that the replica loops operate at one-eightieth of the current of the driver circuits, but approximate the common-mode voltage of the driver circuits. It will be appreciated that the dynamic AC driver replica network 60 is utilized rather than direct sampling of the output common-mode voltage, because the internal circuitry of the driver can not withstand the high voltage fault conditions on the CANH and CANL bus pins. Any attempt to increase the voltage would interfere with normal bus communication.

Transistors MP4 and MP5 form a first current mirror 66 that directs current at MP4 to an upper output current path defined by transistors MP7 and MP9 and an upper loop of the replica circuit defined by MP6 and MP8. Transistors MN11 and MN12 form a differential pair 67 in the control loop that acts as a current steering mechanism for steering current from the current source, $I_p$. The current from current source, $I_p$, is provided to the differential pair via a second current mirror 68, comprising transistors MN9 and MN10. The second current mirror 68 is implemented as a 1:2 current mirror, effectively doubling the current received from $I_p$. A common-mode voltage, $V_{oc(AC)}$, can be sampled from a junction of the replica circuits 62 and 64 and compared to the reference voltage at the differential pair 67.

When the sampled common-mode voltage and the reference signal are equal, the current from the second current mirror 68 is split evenly between the two paths, and a current, $I_{STR}$, approximately equal to that provided at $I_p$, is mirrored into the upper output current path and the upper loop of the replica circuit. When the sampled common-mode voltage is larger than the reference voltage, $CM_{REF}$, the differential pair 67 steers current away from the transistor, MP4, reducing the amount of current, $I_{STR}$, mirrored into the upper output current path and the upper loop of the replica circuit from the first current mirror 66 to lower the common-mode voltage. When the sampled common-mode voltage from the replica circuit is smaller than the reference voltage, $CM_{REF}$, the differential pair 67 steers current toward MP4, increasing the amount of current, $I_{STR}$, mirrored into the upper output current path and the upper loop of the replica circuit from the first current mirror 66 to raise the common-mode voltage. Thus, the common-mode voltage of the driver circuit 70 is modified dynamically to minimize the $V_{oc(pp)}$ signal.

Figure 6:
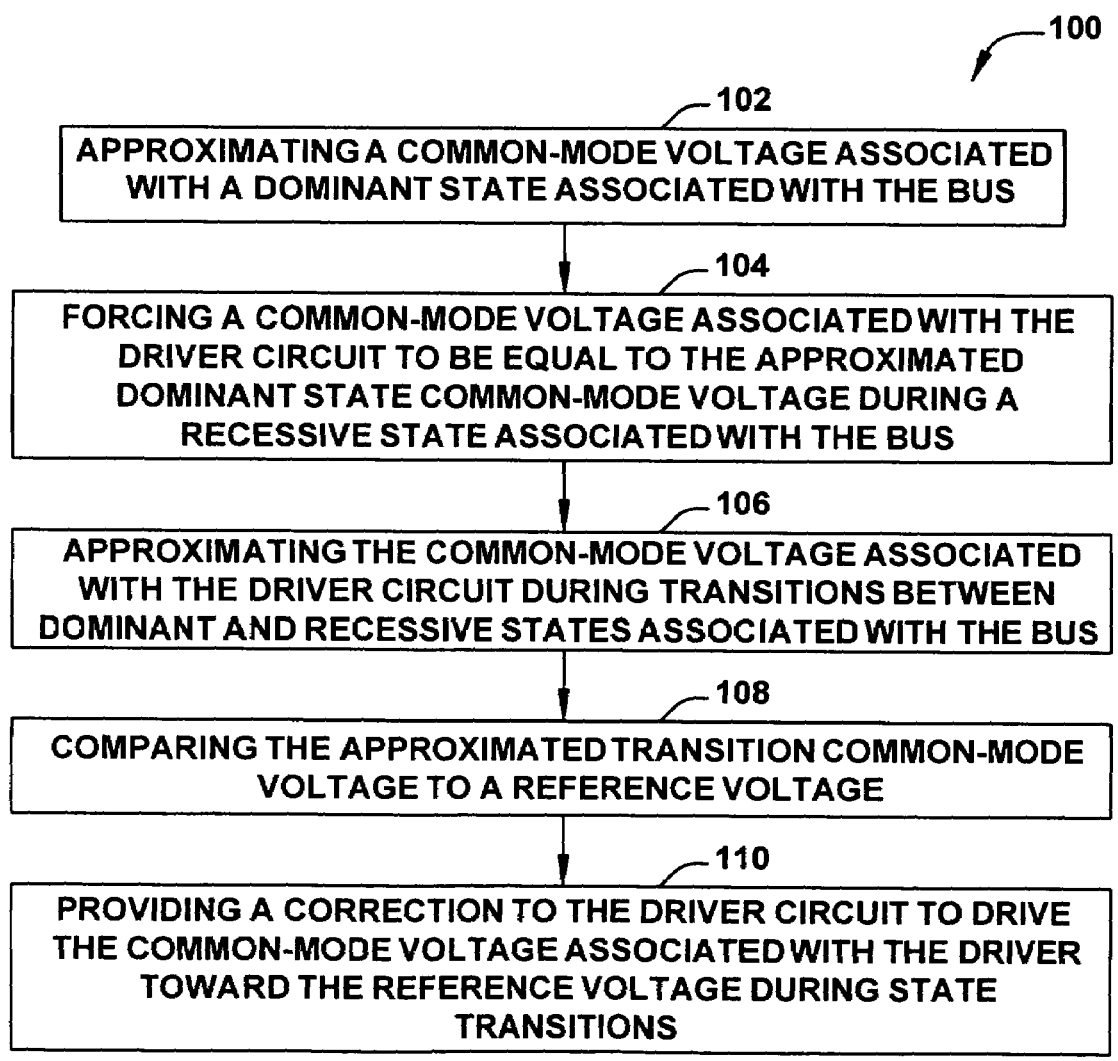
FIG. 6 illustrates a methodology for mitigating the electromagnetic emissions associated with a driver circuit in accordance with an aspect of the present invention.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 6 illustrates a methodology 100 for mitigating the electromagnetic emissions associated with a driver circuit. At 102, a dominant state common-mode voltage associated with a bus is approximated. In an exemplary embodiment, the dominant state common-mode voltage is approximated by sampling a voltage from a static replica circuit that mimics the operation of the driver circuit. At 104, a common-mode voltage associated with the driver circuit is forced to be equal to the approximated dominant state common-mode voltage during a recessive state associated with the bus. For example, the approximated common-mode voltage can be provided to an attenuator network that provides an interface between the driver and the bus to maintain the desired common-mode voltage at the bus.

At 106, the common-mode voltage associated with the driver circuit is approximated during transitions between dominant and recessive states associated with the bus. In an exemplary embodiment, the transition common-mode voltage is approximated by sampling a voltage from a dynamic replica circuit that mimics the operation of the driver circuit during transitions. At 108, the approximated transition common-mode voltage is compared to a reference voltage. At 110, a correction is provided to the driver circuit to drive the common-mode voltage associated with the driver toward the reference voltage during state transitions.

In an exemplary embodiment, a bias current is provided to the driver circuit in the form of a current ramp. The rate of the current ramp is selected to allow time for the common-mode voltage to be corrected during the state transitions. The correction can be applied by steering current from the current source either toward or away from an output portion of the driver circuit. Accordingly, the peak-to-peak variation, $V_{oc(pp)}$, of the common-mode signal is minimized.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A driver system for a controller area network transceiver comprising:
   a driver circuit that is operative to transmit communications across an associated bus;
   a static driver replica circuit that approximates a common-mode voltage associated with a dominant state associated with the bus; and
   a receiver attenuator bias circuit that forces a common-mode voltage associated with the driver circuit to be equal to the approximated dominant state common-mode voltage during a recessive state associated with the bus.

2. The system of claim 1, the receiver attenuator bias circuit comprising an attenuator resistor network that provides an interface between the bus and the driver circuit, the receiver attenuator bias circuit being operative to force the approximated dominant state common-mode voltage onto the attenuator resistor network.

3. The system of claim 2, the receiver attenuator bias circuit further comprising a unity gain buffer amplifier that buffers the approximated dominant state common-mode voltage provided from the static driver replica circuit.

4. The system of claim 1, the static driver replica circuit comprising a scaled replica of the driver circuit, the scaled replica having a resistance greater than that of the driver circuit by a predetermined multiplicative factor, such that it can operate at a voltage approximating that of the driver circuit, while utilizing a current less than that of the driver circuit by the predetermined multiplicative factor.

5. The system of claim 1, further comprising:
   a driver bias circuit that ramps first and second current sources associated with the driver circuit during transitions between the dominant and recessive states associated with the bus; and
   a dynamic driver replica circuit that approximates a common-mode voltage associated with the driver circuit during the state transitions, compares the approximated common-mode voltage to a reference voltage, and provides a correction to the driver circuit to drive the common-mode voltage associated with the driver toward the reference voltage.

6. The system of claim 5, the dynamic driver replica circuit comprising a transistor differential pair that compares the approximated common-mode voltage to the reference voltage and steers current from the first current source according to the comparison.

7. The system of claim 6, the dynamic driver replica circuit comprising a current mirror that doubles the current from the first current source and provides the doubled current to the transistor differential pair.

8. The system of claim 5, the reference voltage comprising the approximated dominant state common-mode voltage associated with the receiver attenuator bias circuit.

9. A driver system for a controller area network transceiver comprising:
   a driver circuit that is operative to transmit communications across an associated bus;
   a driver bias circuit that ramps first and second current sources associated with the driver circuit during transitions between dominant and recessive states associated with the bus; and
   a dynamic driver replica circuit that approximates a common-mode voltage associated with the driver circuit during state transitions, compares the approximated common-mode voltage to a reference voltage, and provides a correction to the driver circuit to drive the common-mode voltage associated with the driver toward the reference voltage.

10. The system of claim 9, the dynamic driver replica circuit comprising a transistor differential pair that compares the approximated common-mode voltage to the reference voltage and steers current from the first current source according to the comparison.

11. The system of claim 10, the dynamic driver replica circuit comprising a current mirror that doubles the current from the first current source and provides the doubled current to the transistor differential pair.

12. The system of claim 9, the dynamic driver replica circuit comprising a scaled replica of the driver circuit, the scaled replica having a resistance greater than that of the driver circuit by a predetermined multiplicative factor, such that it can operate at a voltage approximating that of the driver circuit, but utilize a current less than that of the driver circuit by the predetermined multiplicative factor.

13. The system of claim 9, wherein an associated ramp rate of the driver bias circuit being selected as to facilitate the real time approximation and correction of the common-mode voltage associated with the driver by the dynamic driver replica circuit.

14. The system of claim 9, further comprising:
   a static driver replica circuit that approximates a common-mode voltage associated with the dominant state associated with the bus; and
   a receiver attenuator bias circuit that forces the common-mode voltage associated with the driver circuit to be equal to the approximated dominant state common-mode voltage during a recessive state associated with the bus.

15. The system of claim 14, the receiver attenuator bias circuit comprising an attenuator resistor network that provides an interface between the bus and the driver circuit, the receiver attenuator bias circuit being operative to force the approximated dominant state common-mode voltage onto the attenuator resistor network.

16. The system of claim 15, the receiver attenuator bias circuit further comprising a unity gain buffer amplifier that buffers the approximated dominant state common-mode voltage provided from the static driver replica circuit.

17. A method for mitigating electromagnetic emissions associated with a driver circuit that communicates on an associated bus, comprising:
   approximating a common-mode voltage associated with a dominant state associated with the bus;
   forcing a common-mode voltage associated with the driver circuit to be equal to the approximated dominant state common-mode voltage during a recessive state associated with the bus;
   approximating the common-mode voltage associated with the driver circuit during transitions between dominant and recessive states associated with the bus;
   comparing the approximated transition common-mode voltage to a reference voltage; and providing a correction to the driver circuit to drive the common-mode voltage associated with the driver toward the reference voltage during state transitions.

18. The method of claim 17, wherein approximating the dominant state common-mode voltage comprises sampling a voltage at a first driver replica circuit and approximating the transition common-mode voltage comprises sampling a voltage at a second driver replica circuit.

19. The method of claim 17, further comprising ramping at least one current source associated with the driver at a predetermined rate during state transitions, such that real time approximation and correction of the transition common-mode voltage is facilitated.

20. The method of claim 19, wherein providing a correction to the driver circuit comprises steering current from the at least one current source relative to an output portion of the driver circuit.

* * * * *